(12) United States Patent
Lee et al.

(10) Patent No.: US 10,600,748 B2
(45) Date of Patent: Mar. 24, 2020

(54) FAN-OUT SEMICONDUCTOR PACKAGE

(71) Applicant: SAMSUNG ELECTRONICS CO., LTD., Suwon-si (KR)

(72) Inventors: Doo Hwan Lee, Suwon-si (KR); Jong Rip Kim, Suwon-si (KR); Hyoung Joon Kim, Suwon-si (KR); Jin Yul Kim, Suwon-si (KR); Kyung Seob Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 102 days.

(21) Appl. No.: 15/377,402

(22) Filed: Dec. 13, 2016

(65) Prior Publication Data

US 2017/0365566 A1    Dec. 21, 2017

(30) Foreign Application Priority Data

Jun. 20, 2016  (KR) .................. 10-2016-0076909
Aug. 24, 2016  (KR) .................. 10-2016-0107661

(51) Int. Cl.
*H01L 23/00* (2006.01)
*H01L 23/31* (2006.01)
(Continued)

(52) U.S. Cl.
CPC .......... *H01L 24/02* (2013.01); *H01L 23/3114* (2013.01); *H01L 23/3171* (2013.01);
(Continued)

(58) Field of Classification Search
CPC ..... H01L 23/538; H01L 21/56; H01L 21/683; H01L 21/48; H01L 23/5389;
(Continued)

(56) References Cited

U.S. PATENT DOCUMENTS 6,387,734 B1    5/2002 Inaba et al.
6,492,200 B1    12/2002 Park et al.
(Continued)

FOREIGN PATENT DOCUMENTS

GB    2482894 A    2/2012
JP    2000-294607 A    10/2000
(Continued)

OTHER PUBLICATIONS

Japanese Office Action issued in corresponding Japanese Patent Application No. 2016-247621, dated Apr. 24, 2018, with English Translation.
(Continued)

*Primary Examiner* — Alexander O Williams
(74) *Attorney, Agent, or Firm* — Sughrue Mion, PLLC

(57) ABSTRACT

A fan-out semiconductor package includes: a first interconnection member having a through-hole; a semiconductor chip disposed in the through-hole and having an active surface having connection pads disposed thereon and an inactive surface opposing the active surface; an encapsulant encapsulating at least portions of the first interconnection member and the inactive surface of the semiconductor chip; a second interconnection member disposed on the first interconnection member and the active surface of the semiconductor chip; and a passivation layer disposed on the second interconnection member. The first interconnection member and the second interconnection member include, respectively, redistribution layers electrically connected to the connection pads of the semiconductor chip, the second interconnection member includes an insulating layer on which the redistribution layer of the second interconnection member is disposed, and the passivation layer has a modulus of elasticity greater than that of the insulating layer of the second interconnection member.

33 Claims, 14 Drawing Sheets

(51) Int. Cl.
*H01L 23/538* (2006.01)
*H05K 1/18* (2006.01)
*H01L 23/498* (2006.01)
*H05K 3/46* (2006.01)

(52) U.S. Cl.
CPC .... *H01L 23/49894* (2013.01); *H01L 23/5384* (2013.01); *H01L 23/5386* (2013.01); *H01L 23/5389* (2013.01); *H01L 24/05* (2013.01); *H01L 24/14* (2013.01); *H01L 24/19* (2013.01); *H01L 24/20* (2013.01); *H01L 24/24* (2013.01); *H01L 24/25* (2013.01); *H05K 1/185* (2013.01); *H05K 3/4697* (2013.01); *H01L 23/49816* (2013.01); *H01L 2224/02371* (2013.01); *H01L 2224/02377* (2013.01); *H01L 2224/02379* (2013.01); *H01L 2224/0401* (2013.01); *H01L 2224/04105* (2013.01); *H01L 2224/05008* (2013.01); *H01L 2224/05096* (2013.01); *H01L 2224/05124* (2013.01); *H01L 2224/05541* (2013.01); *H01L 2224/05557* (2013.01); *H01L 2224/05559* (2013.01); *H01L 2224/05569* (2013.01); *H01L 2224/05572* (2013.01); *H01L 2224/05647* (2013.01); *H01L 2224/12105* (2013.01); *H01L 2224/13006* (2013.01); *H01L 2224/13023* (2013.01); *H01L 2224/13111* (2013.01); *H01L 2224/13147* (2013.01); *H01L 2224/1412* (2013.01); *H01L 2224/18* (2013.01); *H01L 2224/211* (2013.01); *H01L 2224/215* (2013.01); *H01L 2224/221* (2013.01); *H01L 2224/24101* (2013.01); *H01L 2224/24155* (2013.01); *H01L 2924/15153* (2013.01); *H01L 2924/19105* (2013.01); *H01L 2924/3511* (2013.01); *H05K 3/4644* (2013.01)

(58) Field of Classification Search
CPC ............ H01L 23/3128; H01L 23/5386; H01L 23/5384; H01L 23/295; H01L 23/5383; H01L 24/02; H01L 23/3171; H01L 24/14; H01L 23/3114; H01L 2224/02371; H01L 2224/02379; H01L 2224/1412; H01L 23/00; H01L 23/31
USPC ................ 257/774, 773, 737, 738, 778, 734
See application file for complete search history.

(56) References Cited

U.S. PATENT DOCUMENTS

| | | | |
|---|---|---|---|
| 8,354,304 B2 | 1/2013 | Chow et al. | |
| 9,082,806 B2* | 7/2015 | Lin | H01L 21/6835 |
| 9,252,065 B2 | 2/2016 | Lin et al. | |
| 9,307,632 B2* | 4/2016 | Lee | H05K 1/0271 |
| 9,385,006 B2 | 7/2016 | Lin et al. | |
| 9,691,686 B2 | 6/2017 | Huang et al. | |
| 9,824,988 B1 | 11/2017 | Lee et al. | |
| 9,842,798 B2 | 12/2017 | Marimuthu et al. | |
| 9,881,873 B2 | 1/2018 | Oh et al. | |
| 10,026,681 B2 | 7/2018 | Ko et al. | |
| 10,042,772 B2 | 8/2018 | Antani et al. | |
| 10,083,929 B2 | 9/2018 | Choi et al. | |
| 2006/0017171 A1 | 1/2006 | Weng | |
| 2008/0089048 A1 | 4/2008 | Yamanno et al. | |
| 2009/0085192 A1 | 4/2009 | Hsu et al. | |
| 2009/0309212 A1 | 12/2009 | Shim et al. | |
| 2010/0144101 A1 | 6/2010 | Chow et al. | |
| 2011/0156248 A1 | 6/2011 | Matsuki | |
| 2012/0013021 A1 | 1/2012 | Kobayashi et al. | |
| 2012/0187557 A1 | 7/2012 | Kyozuka et al. | |
| 2012/0187584 A1 | 7/2012 | Lin et al. | |
| 2012/0319270 A1 | 12/2012 | Chen et al. | |
| 2013/0228897 A1* | 9/2013 | Chen | H01L 24/05 257/621 |
| 2013/0241048 A1 | 9/2013 | Lin et al. | |
| 2014/0044957 A1* | 2/2014 | Hirayama | H01L 23/293 428/327 |
| 2014/0104798 A1* | 4/2014 | Park | H01L 23/49827 361/764 |
| 2014/0182889 A1* | 7/2014 | Shin | H05K 3/4673 174/251 |
| 2014/0182895 A1* | 7/2014 | Lee | H05K 1/0271 174/251 |
| 2015/0001708 A1 | 1/2015 | Lin | |
| 2015/0048515 A1 | 2/2015 | Zhang et al. | |
| 2015/0140736 A1* | 5/2015 | Pendse | H01L 24/19 438/109 |
| 2015/0187742 A1 | 7/2015 | Kwan et al. | |
| 2016/0043047 A1* | 2/2016 | Shim, II | H01L 21/561 257/773 |
| 2016/0240465 A1* | 8/2016 | Chen | H01L 21/486 |
| 2016/0307847 A1* | 10/2016 | Lee | H01L 23/5389 |
| 2016/0336249 A1* | 11/2016 | Kang | H01L 23/3128 |
| 2016/0338202 A1* | 11/2016 | Park | H01L 23/48 |
| 2017/0040265 A1* | 2/2017 | Park | H01L 24/19 |
| 2017/0077022 A1* | 3/2017 | Scanlan | H01L 23/49838 |
| 2017/0103951 A1* | 4/2017 | Lee | H01L 21/4857 |
| 2017/0125318 A1* | 5/2017 | Harr | H01L 23/3128 |
| 2017/0133293 A1* | 5/2017 | Oh | H01L 23/481 |
| 2017/0133309 A1* | 5/2017 | Kim | H01L 23/3128 |

FOREIGN PATENT DOCUMENTS

| | | | |
|---|---|---|---|
| JP | 2001-257282 A | 9/2001 | |
| JP | 2008-98366 A | 4/2008 | |
| JP | 2009-026833 A | 2/2009 | |
| JP | 2011-134942 A | 7/2011 | |
| JP | 2012-039090 A | 2/2012 | |
| JP | 2012-146769 A | 8/2012 | |
| JP | 2012-156251 A | 8/2012 | |
| JP | 2012-209432 A | 10/2012 | |
| JP | 2013-026438 A | 2/2013 | |
| JP | 2013-258238 A | 12/2013 | |
| JP | 2014-082493 A | 5/2014 | |
| JP | 2015-035568 A | 2/2015 | |
| JP | 2015035568 A | * 2/2015 | |
| JP | 2015-178635 A | 10/2015 | |
| JP | 2006-287048 A | 10/2016 | |
| KR | 10-2000-0001598 A | 1/2000 | |
| KR | 2002-0079136 A | 10/2002 | |
| KR | 2003-0010955 A | 2/2003 | |
| KR | 10-2004-0083192 A | 10/2004 | |
| KR | 10-2013-0132163 A | 4/2013 | |
| KR | 20130132163 A | * 12/2013 | |
| KR | 10-1362715 B1 | 2/2014 | |
| TW | 200605244 | 2/2006 | |
| TW | 201427527 A | * 1/2014 | |
| TW | 201427527 A | 7/2014 | |
| TW | 201436660 A | 9/2014 | |
| WO | 2010/010910 A1 | 1/2010 | |
| WO | 2010/101167 A1 | 9/2010 | |
| WO | 2011/058879 A1 | 5/2011 | |
| WO | 2013/011850 A1 | 1/2013 | |

OTHER PUBLICATIONS

Office Action issued in related U.S. Appl. No. 15/905,062 dated Oct. 2, 2018.
Office Action issued in Japanese Patent Application No. 2016-247621 dated Nov. 6, 2018, with English translation.
Office Action issued in Korean Patent Application No. 10-2016-0107661 dated Nov. 20, 2018, with English translation.
Taiwanese Office Action issued in corresponding Taiwanese Patent Application No. 105142339, dated Jun. 19, 2018, with English Translation.

(56) References Cited

OTHER PUBLICATIONS

Taiwanese Office Action dated Apr. 16, 2019 issued in Taiwanese Patent Application No. 105142339 (with English translation).

* cited by examiner

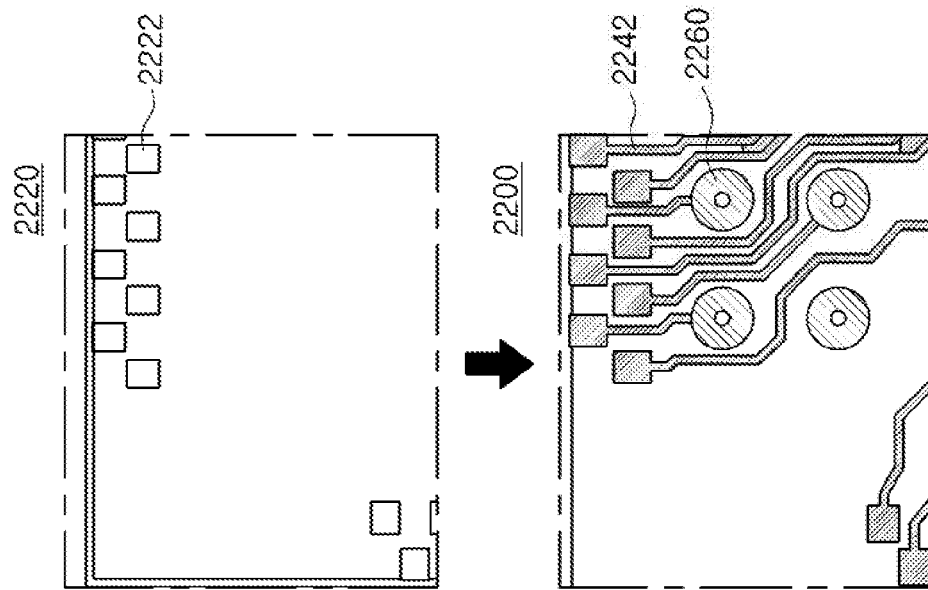
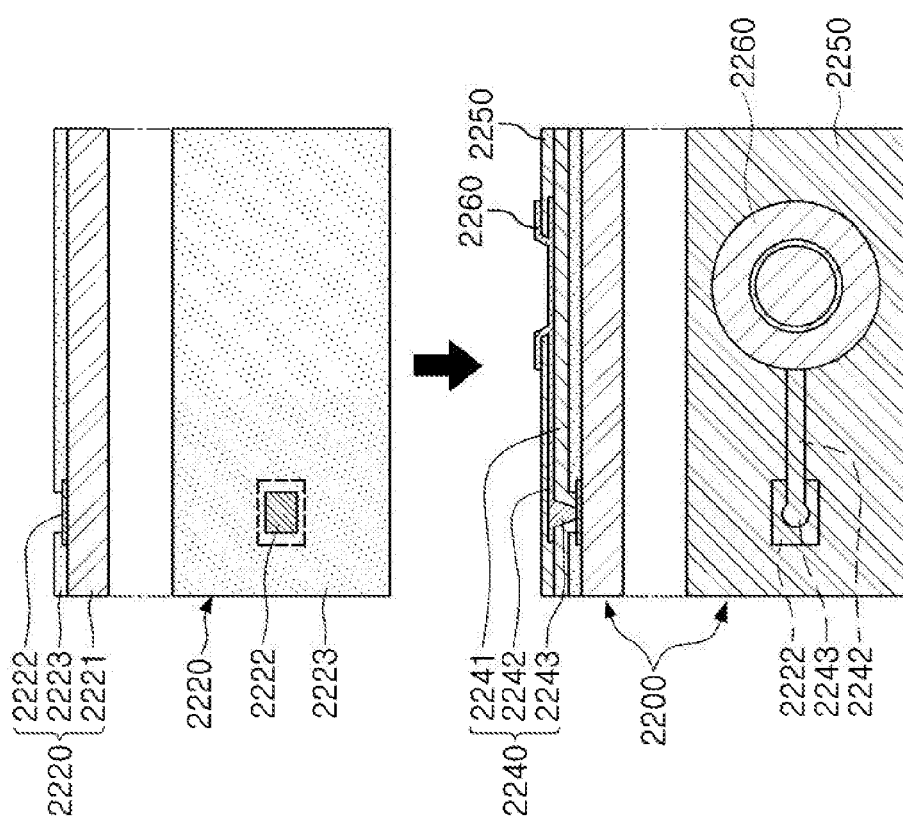
FIG. 3B
FIG. 3A

I-I'

FAN-OUT SEMICONDUCTOR PACKAGE

CROSS-REFERENCE TO RELATED APPLICATION(S)

This application claims benefit of priority to Korean Patent Application Nos. 10-2016-0076909 filed on Jun. 20, 2016 and 10-2016-0107661 filed on Aug. 24, 2016 in the Korean Intellectual Property Office, the disclosures of which are incorporated herein by reference in their entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

Recently, a significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of package technology suggested to satisfy the technical demand as described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package of which board level reliability is improved.

According to an aspect of the present disclosure, a fan-out semiconductor package may be provided, in which a material satisfying certain conditions is used as a material of a passivation layer.

According to an aspect of the present disclosure, a fan-out semiconductor package may include: a first interconnection member having a through-hole; a semiconductor chip disposed in the through-hole of the first interconnection member and having an active surface having connection pads disposed thereon and an inactive surface opposing the active surface; an encapsulant encapsulating at least portions of the first interconnection member and the inactive surface of the semiconductor chip; a second interconnection member disposed on the first interconnection member and the active surface of the semiconductor chip; and a passivation layer disposed on the second interconnection member. The first interconnection member and the second interconnection member include, respectively, redistribution layers electrically connected to the connection pads of the semiconductor chip, the second interconnection member includes an insulating layer on which the redistribution layer of the second interconnection member is disposed, and the passivation layer has a modulus of elasticity greater than that of the insulating layer of the second interconnection member.

According to another aspect of the present disclosure, a fan-out semiconductor package may include: a first interconnection member having a through-hole; a semiconductor chip disposed in the through-hole of the first interconnection member and having an active surface having connection pads disposed thereon and an inactive surface opposing the active surface; an encapsulant encapsulating at least portions of the first interconnection member and the inactive surface of the semiconductor chip; a second interconnection member disposed on the first interconnection member and the active surface of the semiconductor chip; and a passivation layer disposed on the second interconnection member. The first interconnection member and the second interconnection member include, respectively, redistribution layers electrically connected to the connection pads of the semiconductor chip, the second interconnection member includes an insulating layer on which the redistribution layer of the second interconnection member is disposed, each of the passivation layer and the insulating layer of the second interconnection member includes an inorganic filler and an insulating resin, and a weight percentage of the inorganic filler included in the passivation layer is greater than that of the inorganic filler included in the insulating layer of the second interconnection member.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
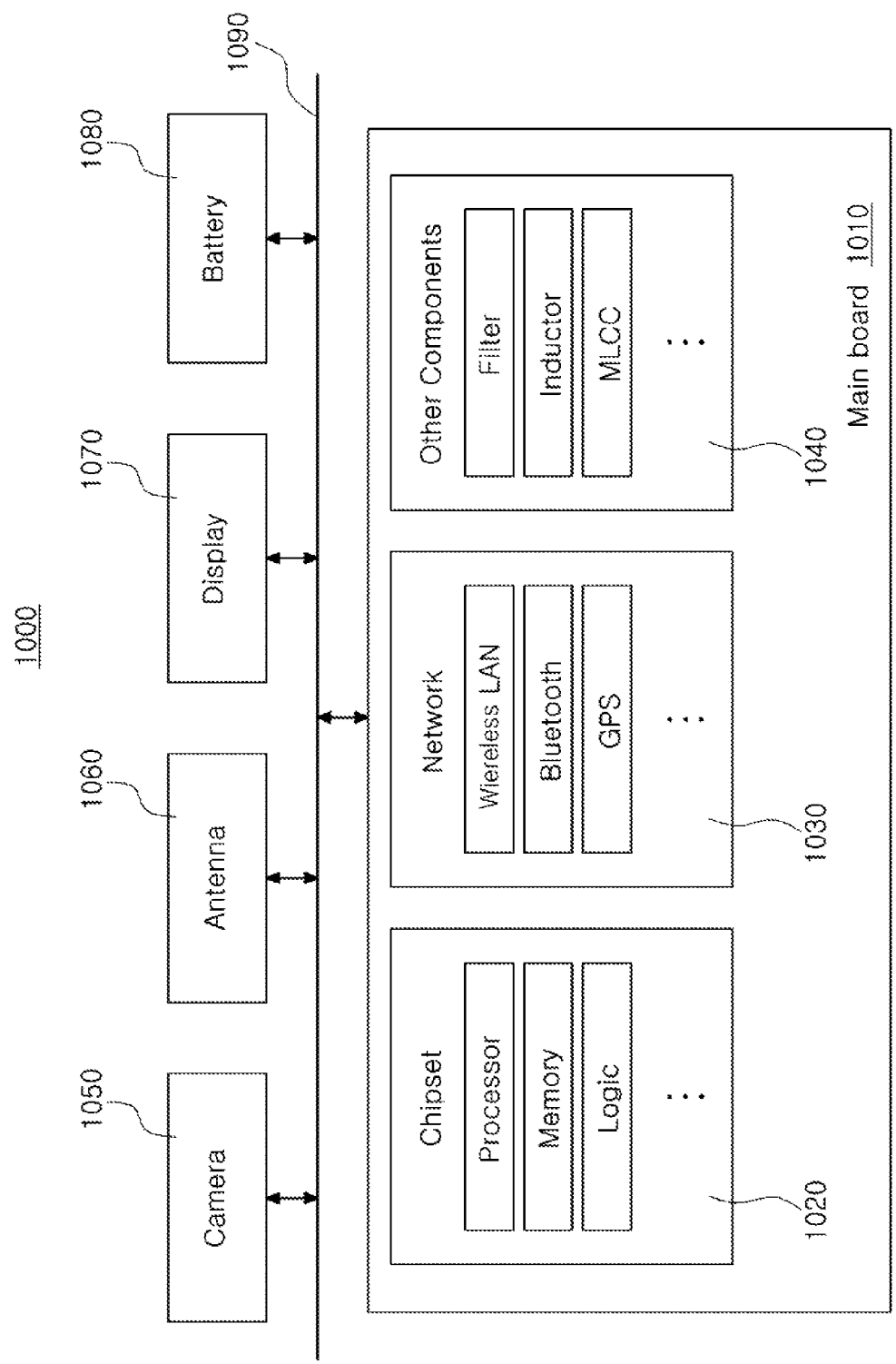
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
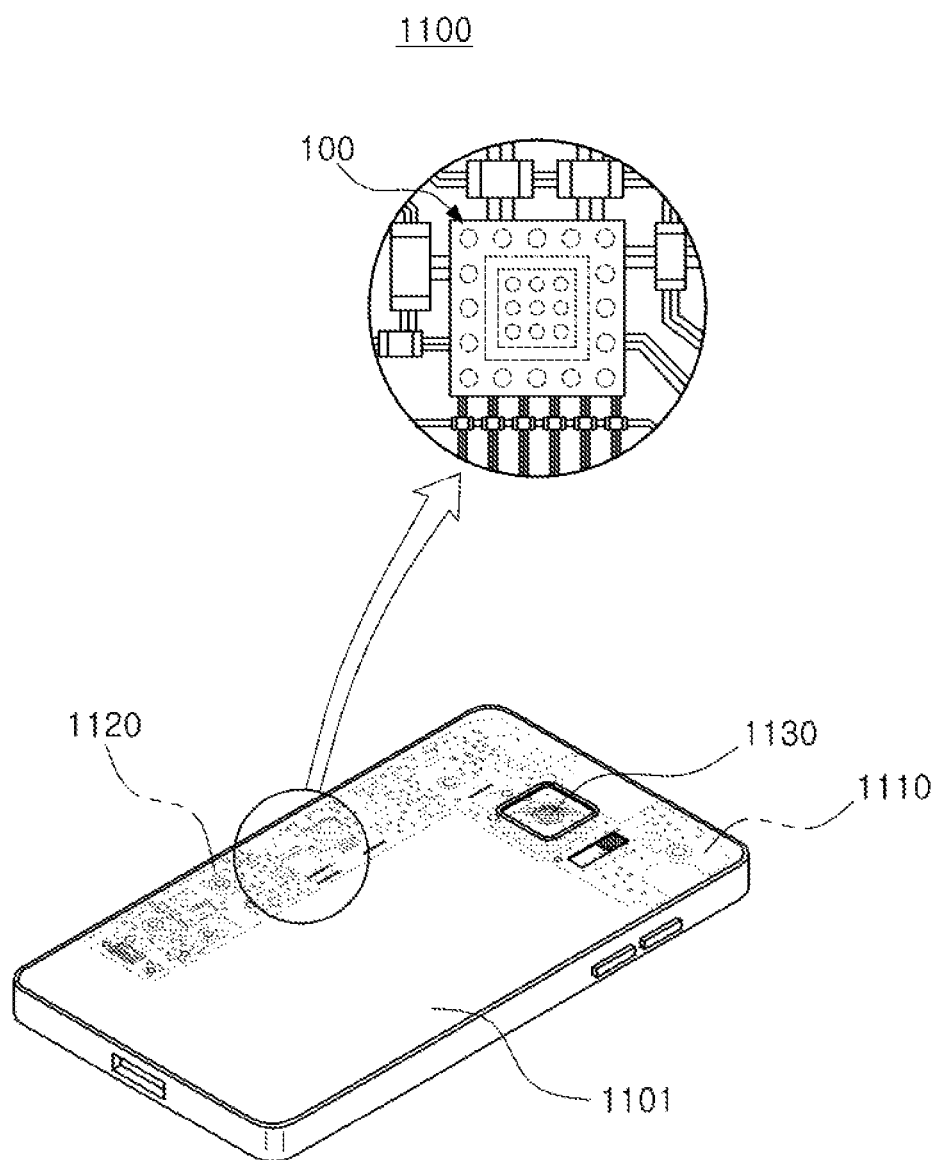
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
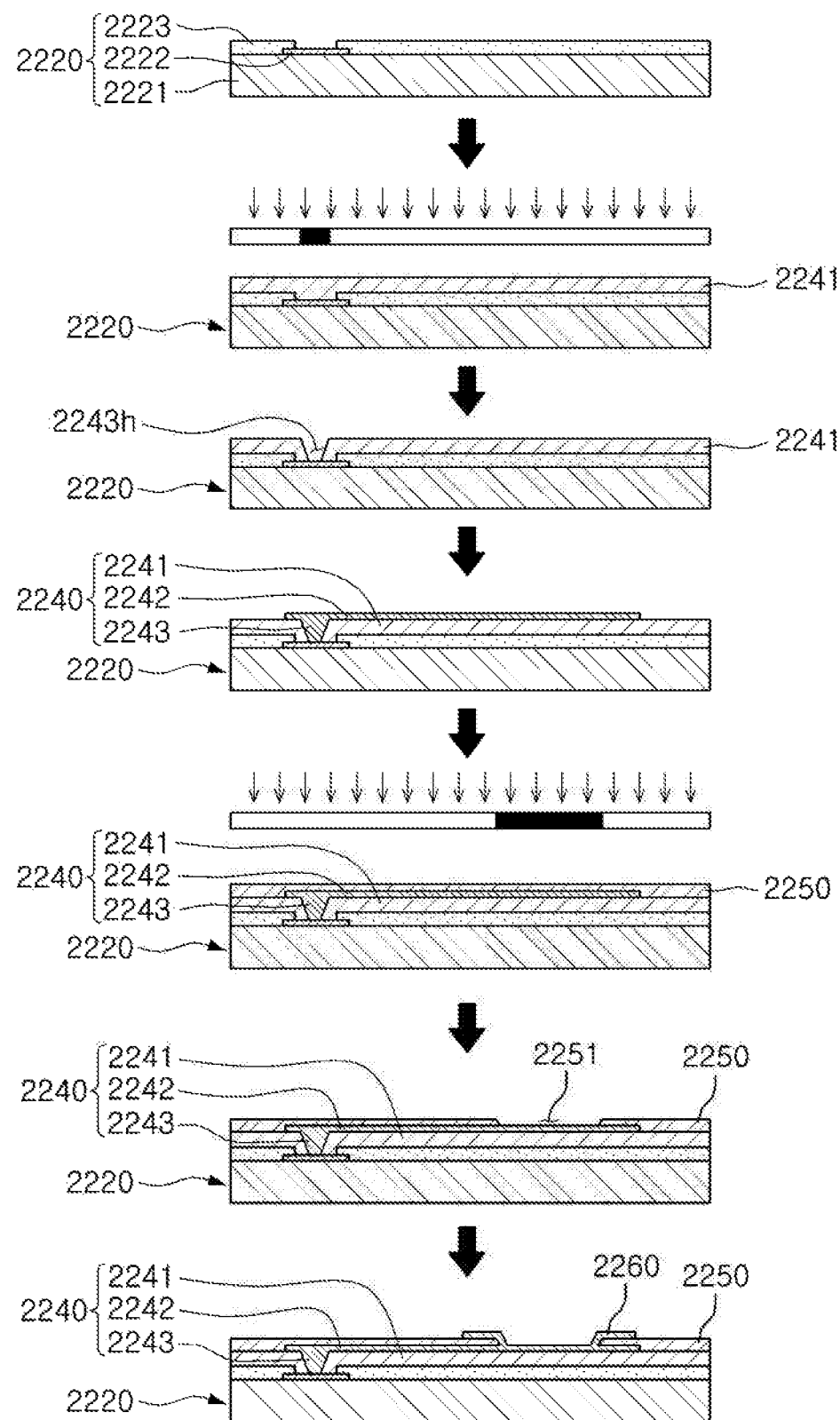
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, an interconnection member 2240 may be formed depending on a size of the semiconductor chip 2220 on the semiconductor chip 2220 in order to redistribute the connection pads 2222. The interconnection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2200 including, for example, the semiconductor chip 2220, the interconnection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
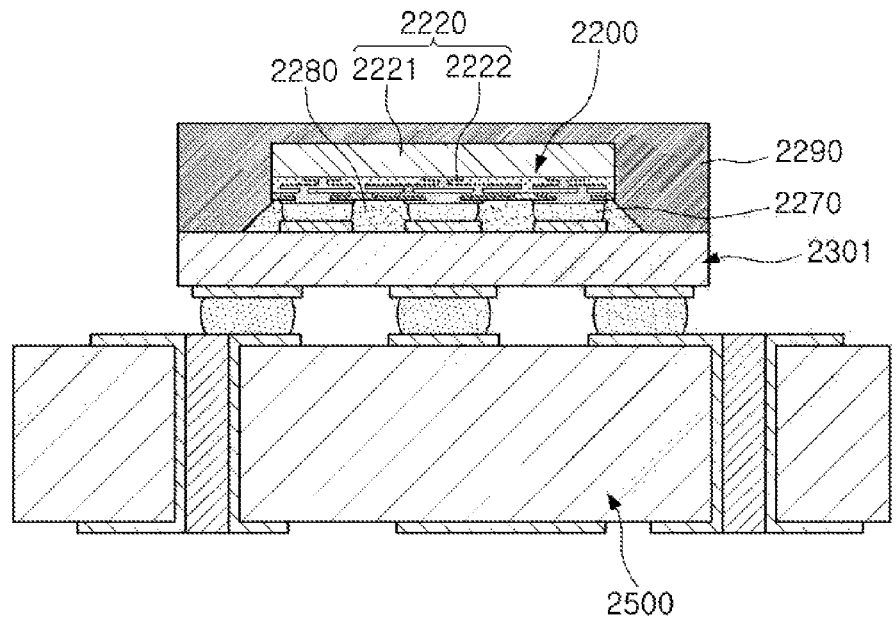
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
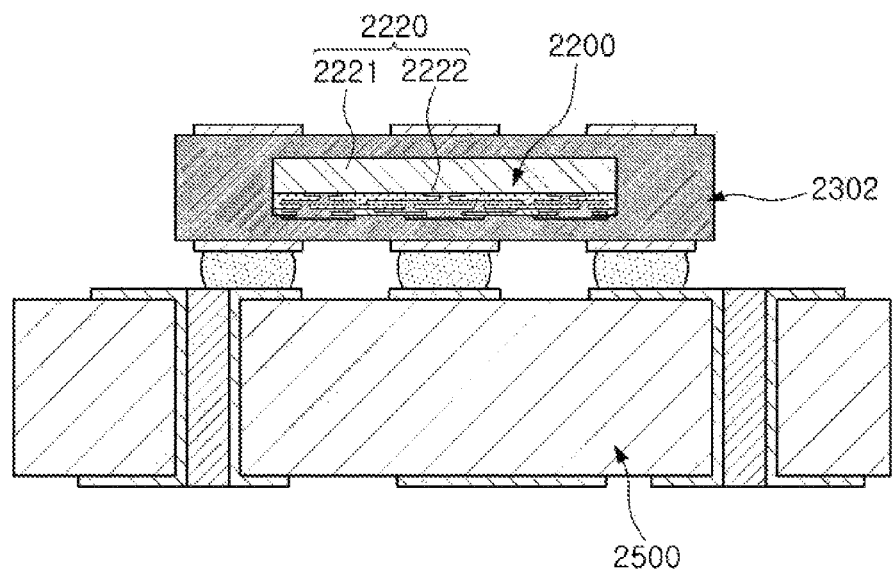
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
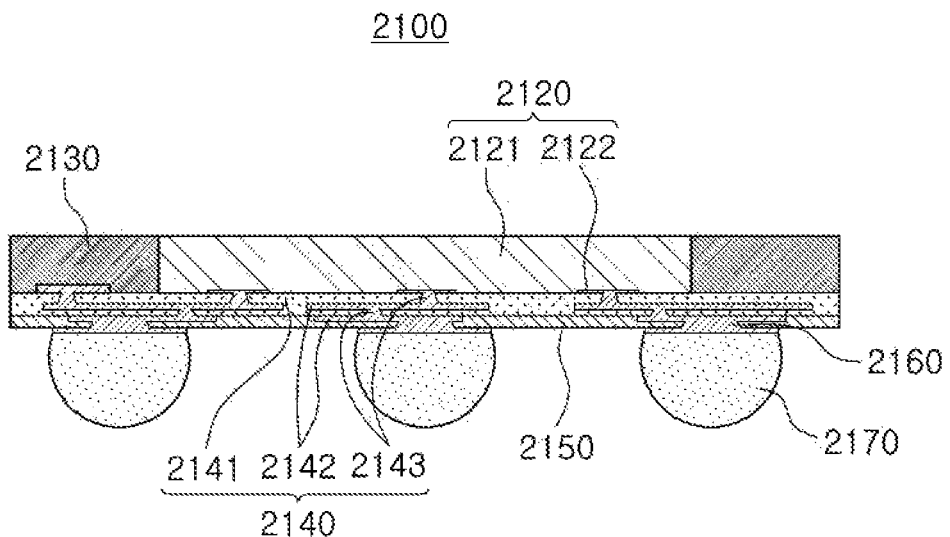
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by an interconnection member 2140. In this case, a passivation layer 2150 may be further formed on the interconnection member 2140, and an under-bump metal layer 2160 may be further formed in openings of the passivation layer 2150. Solder balls 2170 may be further formed on the under-bump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all I/O terminals of the semiconductor chip need to be disposed inside the semiconductor chip.

Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
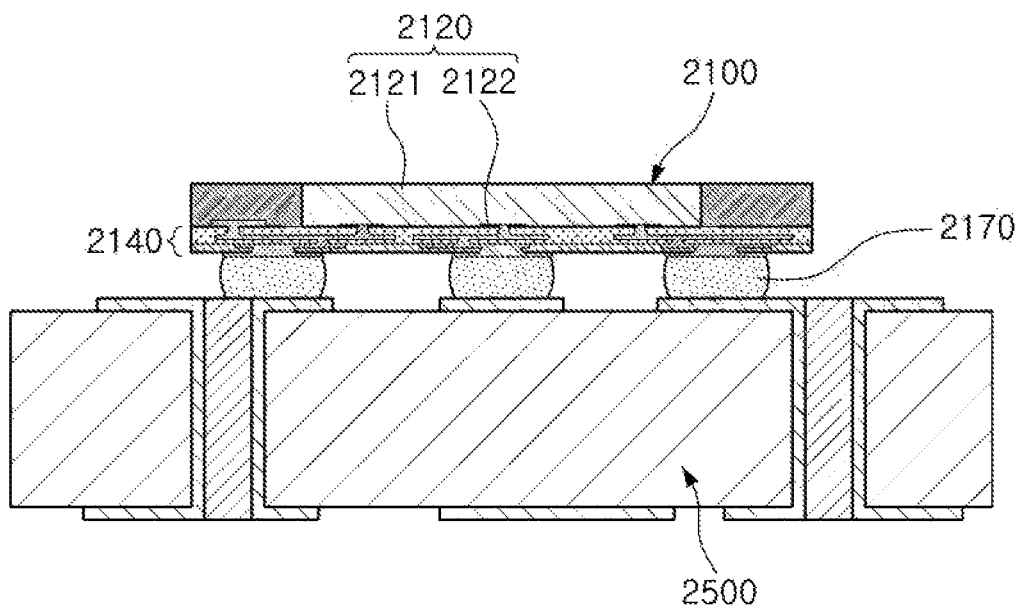
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package of which reliability is improved will hereinafter be described with reference to the drawings.

Figure 9:
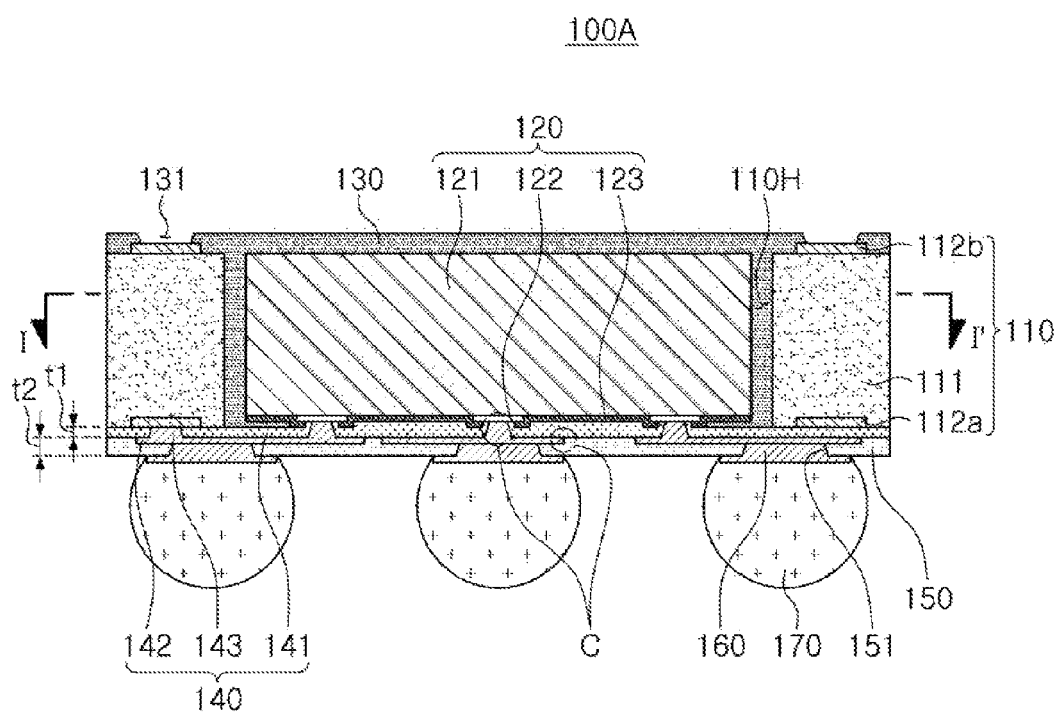
FIG. 9 is a schematic cross-sectional view illustrating an example of a fan-out semiconductor package.

FIG. 9 is a schematic cross-sectional view illustrating an example of a fan-out semiconductor package.

Figure 10:
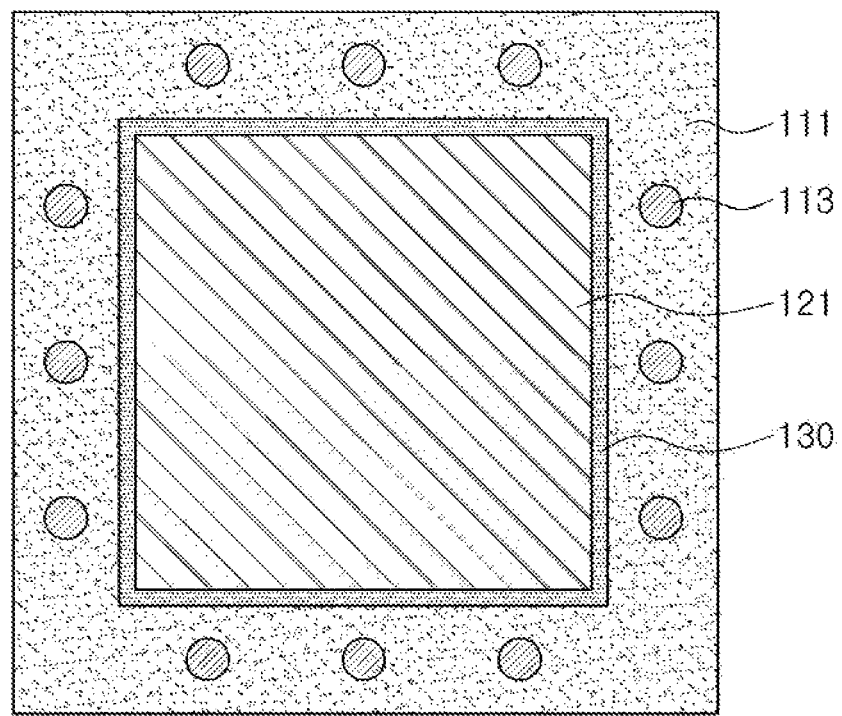
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first interconnection member 110 having a through-hole 110H, a semiconductor chip 120 disposed in the through-hole 110H of the first interconnection member 110 and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, a passivation layer 150 disposed on the second interconnection member 140, an under-bump metal layer 160 formed in openings 151 of the passivation layer 150, and connection terminals 170 formed on the under-bump metal layer 160. In this case, the passivation layer 150 may have a modulus of elasticity greater than that of an insulating layer 141 of the second interconnection member 140. In a case in which each of the passivation layer 150 and the insulating layer 141 of the second interconnection member 140 includes an inorganic filler and an insulating resin, a weight percentage of the inorganic filler included in the passivation layer 150 may be greater than that of the inorganic filler included in the insulating layer 141 of the second interconnection member 140.

A recent main issue related to a semiconductor package is whether or not the semiconductor package has sufficient reliability when the semiconductor package as described above is mounted on a main board of an electronic device. That is, many efforts to secure reliability in matching of vias to connection pads of a semiconductor chip and reliability of connection in a redistribution layer connected to the connection pads have been conducted. Generally, the semiconductor package further includes a passivation layer formed on an outer surface of the redistribution layer. In this case, as a material of the passivation layer, a solder resist having a physical property similar to that of a material of an insulating layer of the redistribution layer, that is, a photosensitive resin, is used. However, in this case, when the semiconductor package is mounted on the main board of the electronic device, stress is transferred from the main board to the semiconductor package as it is, and thus, it is difficult to secure the reliability described above.

On the other hand, in the fan-out semiconductor package 100A according to the exemplary embodiment, a material satisfying certain conditions may be used as a material of the passivation layer 150, and thus, the reliability described above may be easily secured. In detail, the passivation layer 150 may have a modulus of elasticity greater than that of the insulating layer 141 of the second interconnection member 140, and thus, stress applied to the passivation layer 150 may be increased. In a case in which stress is concentrated on the passivation layer 150 rather than on the insulating layer 141, reliability may be easily secured in a region C in which reliability may be problematic in the insulating layer 141, for example, portions in which vias 143 are bonded to the connection pads of the semiconductor chip, portions in which redistribution layers 142 are bonded to insulating layers 141, and the like. The modulus of elasticity is defined as a ratio between stress and deformation, and may be measured through a standard tension test specified in, for example, JIS C-6481, KS M 3001, KS M 527-3, ASTM D882, and the like. In the case in which each of the passivation layer 150 and the insulating layer 141 of the second interconnection member 140 includes the inorganic filler and the insulating resin, the weight percentage of the inorganic filler included in the passivation layer 150 may be greater than that of the inorganic filler included in the insulating layer 141 of the second interconnection member 140. In this case, stress applied to the passivation layer 150 may also be increased, and the reliability may be easily secured.

Meanwhile, a thickness t2 of the passivation layer 150 may be 10 μm or more, for example, about 10 to 30 μm. As the thickness t2 of the passivation layer 150 to which stress generated by the main board is primarily transferred through the connection terminals 170 is increased, stress applied to the passivation layer 150 may be reduced. In addition, crack resistance may be increased. That is, in a case in which the thickness t2 of the passivation layer 150 is 10 μm or more, improved reliability may be secured. In order to concentrate stress, the thickness t2 of the passivation layer 150 may be greater than a thickness t1 of the insulating layer 141 of the second interconnection member 140. The thickness t2 refers to a thickness of the passivation layer 150 after being hardened, and may be measured using a general thickness measuring apparatus.

In addition, a surface roughness Ra of the passivation layer 150 may be 1 nm or more, for example, about 1 nm to 1000 nm. The redistribution layer 142 of the second interconnection member 140 formed at the outermost layer may contact the passivation layer 150. In this case, when the surface roughness Ra of the passivation layer 150 is at least 1 nm or more, close adhesion between the passivation layer 150 and the redistribution layer 142 may be sufficient to reduce stress applied to the passivation layer 150. In addition, generation of an initial crack may be prevented. That is, also in a case in which the surface roughness Ra of the passivation layer 150 is 1 nm or more, improved reliability may be secured. In the case in which the thickness t2 of the passivation layer 150 is 10 μm or more, improved reliability may be secured. The surface roughness may be formed by a known method such as surface treatment using cubic zirconia (CZ). However, all surfaces of the passivation layer 150 do not need to necessarily have this surface roughness, and it may be sufficient that a surface of the passivation layer 150 be in contact with the redistribution layer 142 of the second interconnection member 140 has this surface roughness. The surface roughness may also be measured using a general roughness measuring apparatus.

In addition, water absorption of the passivation layer 150 may be 1.5% or less, for example, about 0.5 to 1.5%. As the water absorption of the passivation layer 150 formed at the outermost portion of the fan-out semiconductor package 100A becomes lower, permeation of water, or the like, into the fan-out semiconductor package 100A may be effectively prevented, resulting in preventing a decrease in close adhesion among components in the fan-out semiconductor package 100A. In addition, a decrease in a physical property of the insulating layer 141, the passivation layer 150, or the like, may also be prevented. Further, the generation of interface vapor pressure among the components in the fan-out semiconductor package 100A may also be prevented. That is, also in a case in which the water absorption of the passivation layer 150 is 1.5% or less, improved reliability may be secured. In a case in which the thickness of the passivation layer 150 is 10 μm or more and the surface roughness of the passivation layer 150 is 1 nm or more as well as in a case in which the water absorption of the passivation layer 150 is 1.5% or less, improved reliability may be secured. The water absorption may be measured by a known method.

In addition, a value obtained by multiplying the elastic module of the passivation layer 150 by a coefficient of thermal expansion (CTE) may be 230 GPa·ppm/° C. or less, for example, about 130 to 230 GPa·ppm/° C. As the value obtained by multiplying the elastic module of the passivation layer 150 by the CTE becomes larger, stress applied to the passivation layer 150 may be increased. The CTE may be measured using a thermo-mechanical analyzer (TMA), a dynamic mechanical analyzer (DMA), or the like.

The respective components included in the fan-out semiconductor package 100A according to the exemplary embodiment will hereinafter be described below in more detail.

The first interconnection member 110 may include the redistribution layers 112a and 112b redistributing the connection pads 122 of the semiconductor chip 120 to thus reduce the number of layers of the second interconnection member 140. If necessary, the first interconnection member 110 may maintain rigidity of the fan-out semiconductor package 100A depending on certain materials, and serve to secure uniformity of a thickness of the encapsulant 130. In some cases, due to the first interconnection member 110, the fan-out semiconductor package 100A according to the exemplary embodiment may be used as a portion of a package-on-package. The first interconnection member 110 may have the through-hole 110H. The through-hole 110H may have the semiconductor chip 120 disposed therein to be spaced apart from the first interconnection member 110 by a predetermined distance. Side surfaces of the semiconductor chip 120 may be surrounded by the first interconnection member 110. However, such a form is only an example and may be variously modified to have other forms, and the fan-out semiconductor package 100A may perform another function depending on such a form.

The first interconnection member 110 may include an insulating layer 111 in contact with the second interconnection member 140, a first redistribution layer 112a in contact with the second interconnection member 140 and embedded in the insulating layer 111, and a second redistribution layer 112b disposed on the other surface of the insulating layer 111 opposing one surface of the insulating layer 111 in which the first redistribution layer 112a is embedded. The first interconnection member 110 may include vias 113 penetrating through the insulating layer 111 and electrically connecting the first and second redistribution layers 112a and 112b to each other. The first and second redistribution layers 112a and 112b may be electrically connected to the connection pads 122. When the first redistribution layer 112a is embedded in the insulating layer 111, a step portion generated due to a thickness of the first redistribution layer 112a may be significantly reduced, and an insulating distance of the second interconnection member 140 may thus become constant. That is, a difference between a distance from the redistribution layer 142 of the second interconnection member 140 to a lower surface of the insulating layer 111 and a distance from the redistribution layer 142 of the second interconnection member 140 to the connection pads 122 may be smaller than a thickness of the first redistribution layer 112a. Therefore, a high density wiring design of the second interconnection member 140 may be easy.

A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass cloth (or a glass fabric), for example, prepreg, Ajinomoto Build up Film (ABF), FR-4, Bismaleimide Triazine (BT), or the like. Alternatively, a photoimagable dielectric (PID) resin may also be used as the insulating material.

The redistribution layers 112a and 112b may serve to redistribute the connection pads 122 of the semiconductor chip 120. A material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may perform various functions depending on designs of their corresponding layers. For example, the redistribution layers 112a and 112b may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a and 112b may include a via pad, a connection terminal pad, and the like. As a non-restrictive example, both of the redistribution layers 112a and 112b may include a ground pattern. In this case, the number of ground patterns formed on the redistribution layers 142 of the second interconnection member 140 may be significantly reduced, such that a degree of wiring design freedom may be improved.

Surface treatment layers (not illustrated) may be further formed on portions of the redistribution layer 112b exposed through openings 131 formed in the encapsulant 130, if necessary. The surface treatment layers (not illustrated) are not particularly limited as long as they are known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 113 may electrically connect the redistribution layers 112a and 112b formed on different layers to each other, resulting in an electrical path being formed in the first interconnection member 110. Each of the vias 113 may also be formed of a conductive material. Each of the vias 113 may be completely filled with the conductive material, as illustrated in FIG. 10, or the conductive material may also be formed along a wall of each of the vias 113. In addition, each of the vias 113 may have all shapes known in the related art, such as a tapered shape, a cylindrical shape, and the like. Meanwhile, as seen from a process to be described below, when holes for the vias 113 are formed, some of the pads of the first redistribution layer 112a may serve as a stopper, and it thus may be advantageous in a process that each of the vias 113 has the tapered shape of which a width of an upper surface is greater than that of a lower surface. In this case, the vias 113 may be integrated with portions of the second redistribution layer 112b.

The semiconductor chip 120 may be an integrated circuit (IC) provided in an amount of several hundreds to several millions of elements or more, integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pads 122 may have a step portion with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions.

The inactive surface of the semiconductor chip 120 may be disposed on a level below an upper surface of the second redistribution layer 112b of the first interconnection member 110. For example, the inactive surface of the semiconductor chip 120 may be disposed on a level below an upper surface of the insulating layer 111 of the first interconnection member 110. A height difference between the inactive surface of the semiconductor chip 120 and the upper surface of the second redistribution layer 112b of the first interconnection member 110 may be 2 μm or more, for example, 5 μm or more. In this case, generation of cracks in corners of the inactive surface of the semiconductor chip 120 may be effectively prevented. In addition, a deviation of an insulating distance on the inactive surface of the semiconductor chip 120 in a case in which the encapsulant 130 is used may be significantly reduced.

The encapsulant 130 may protect the first interconnection member 110 and/or the semiconductor chip 120. An encapsulation form of the encapsulant 130 is not particularly limited, but may be a form in which the encapsulant 130 surrounds at least portions of the first interconnection member 110 and/or the semiconductor chip 120. For example, the encapsulant 130 may cover the first interconnection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second interconnection member 140. Meanwhile, the encapsulant 130 may fill the through-hole 110H to thus serve as an adhesive and reduce buckling of the semiconductor chip 120 depending on certain materials.

The certain materials of the encapsulant 130 are not particularly limited. For example, an insulating material may be used as the material of the encapsulant 130. In this case, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an EMC, or the like, may also be used. Alternatively, a material in which a thermosetting resin or a thermoplastic resin is impregnated together with an inorganic filler in a core material such as a glass cloth (or a glass fabric) may also be used as the insulating material.

The encapsulant 130 may include a plurality of layers formed of a plurality of materials. For example, a space within the through-hole 110H may be filled with a first encapsulant, and the first interconnection member 110 and the semiconductor chip 120 may be covered with a second encapsulant.

Alternatively, the first encapsulant may cover the first interconnection member 110 and the semiconductor chip 120 at a predetermined thickness while filling the space within the through-hole 110H, and the second encapsulant may again cover the first encapsulant at a predetermined thickness. In addition to the form described above, various forms may be used.

The encapsulant 130 may include conductive particles in order to block electromagnetic waves, if necessary. For example, the conductive particles may be any material that may block electromagnetic waves, for example, copper (Cu), aluminum (Al), silver (Ag), tin (Sn), gold (Au), nickel (Ni), lead (Pb), titanium (Ti), a solder, or the like. However, this is only an example, and the conductive particles are not particularly limited thereto.

The second interconnection member 140 may be configured to redistribute the connection pads 122 of the semiconductor chip 120. Several tens to several hundreds of connection pads 122 having various functions may be redistributed by the second interconnection member 140, and may be physically or electrically connected to an external source through connection terminals 170 to be described below depending on the functions. The second interconnection member 140 may include insulating layers 141, the redistribution layers 142 disposed on the insulating layers 141, and vias 143 penetrating through the insulating layers 141 and connecting the redistribution layers 142 to each other. In the fan-out semiconductor package 100A according to the exemplary embodiment, the second interconnection member 140 may include a single layer, but may also include a plurality of layers.

An insulating material may be used as a material of the insulating layers 141. In this case, a photosensitive insulating material such as a photoimagable dielectric (PID) resin may also be used as the insulating material. That is, the insulating layer 141 may be a photosensitive insulating layer. In a case in which the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142 may include a via pad, a connection terminal pad, and the like.

Surface treatment layers (not illustrated) may be formed on the exposed redistribution layer 142, if necessary. The surface treatment layers (not illustrated) are not particularly limited as long as they are known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 143 may electrically connect the redistribution layers 142, the connection pads 122, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. The via 143 may be completely filled with the conductive material, or the conductive material may also be formed along a wall of the via. In addition, the via 143 may have all shapes known in the related art, such as a tapered shape, a cylindrical shape, and the like.

Thicknesses of the redistribution layers 112a and 112b of the first interconnection member 110 may be greater than those of the redistribution layers 142 of the second interconnection member 140. Since the first interconnection member 110 may have a thickness equal to or greater than that of the semiconductor chip 120, the redistribution layers 112a and 112b formed in the first interconnection member 110 may be formed to have large sizes depending on a scale of the first interconnection member 110. On the other hand, the redistribution layers 142 of the second interconnection member 140 may be formed at sizes relatively smaller than those of the redistribution layers 112a and 112b of the first interconnection member 110 for thinness of the second interconnection member 140.

The passivation layer 150 may be configured to protect the second interconnection member 140 from external physical or chemical damage. The passivation layer 150 may have openings 151 formed of a plurality of holes exposing at least portions of the redistribution layer 142 of the second interconnection member 140. The number of openings 151 formed in the passivation layer 150 may be several tens to several thousands.

A material having a modulus of elasticity greater than that of the insulating layer 141 of the second interconnection member 140 may be used as a material of the passivation layer 150. For example, ABF that does not include a glass cloth (or a glass fabric), but includes an inorganic filler and an insulating resin, or the like, may be used as the material of the passivation layer 150. When the ABF, or the like, is used as the material of the passivation layer 150, a weight percentage of the inorganic filler included in the passivation layer 150 may be greater than that of the inorganic filler included in the insulating layer 141 of the second interconnection member 140. In this condition, reliability may be improved. When the ABF, or the like, is used as the material of the passivation layer 150, the passivation layer 150 may be a non-photosensitive insulating layer including the inorganic filler, and may be effective in improving reliability, but is not limited thereto.

An under-bump metal layer 160 may be additionally configured to improve connection reliability of the connection terminals 170 and improve board level reliability of the fan-out semiconductor package 100A. The under-bump metal layer 160 may be connected to the redistribution layer 142 of the second interconnection member 140 exposed through the openings 151 of the passivation layer 150. The under-bump metal layer 160 may be formed in the openings 151 of the passivation layer 150 by the known metallization method using the known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed of the single layer, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less. When the connection terminals 170 are solder balls, the connection terminals 170 may cover side surfaces of the under-bump metal layer 160 extending onto one surface of the passivation layer 150, and connection reliability may be improved.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Although not illustrated in the drawings, a metal layer may be further disposed on an inner wall of the through-hole 110H of the first interconnection member 110, if necessary. That is, the side surfaces of the semiconductor chip 120 may also be surrounded by the metal layer. Heat generated by the semiconductor chip 120 may be effectively dissipated in an upward or downward direction of the fan-out semiconductor package 100A through the metal layer, and electromagnetic waves may be effectively blocked through the metal layer. In addition, if necessary, a plurality of semiconductor chips may be disposed in the through-hole 110H of the first interconnection member 110, and the number of through-holes 110H of the first interconnection member 110 may be plural and semiconductor chips may be disposed in the through-holes, respectively. In addition, separate passive components such as a condenser, an inductor, and the like, may be disposed together with the semiconductor chip in the through-hole 110H. In addition, a surface mounted component may also be mounted on the passivation layer 150 to be positioned on a level that is substantially the same as that of the connection terminal 170.

Figure 11A:
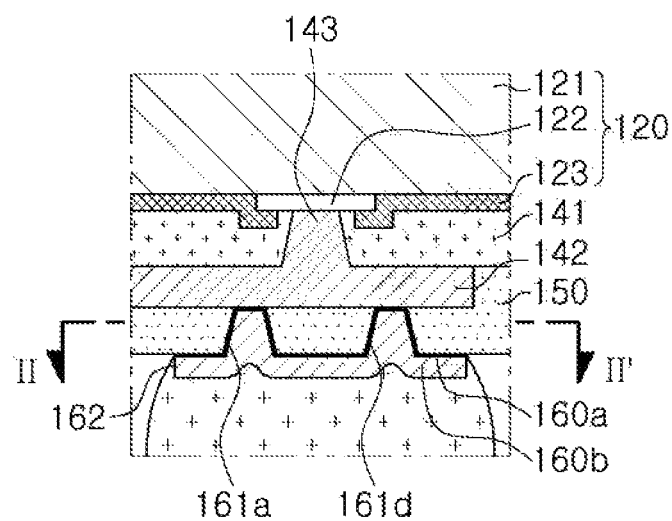
FIGS. 11A and 11B are, respectively, a schematic cross-sectional view and a schematic plan view illustrating a modified example of an opening of a passivation layer and an under-bump metal layer of the fan-out semiconductor package of FIG. 9.
Figure 11B:
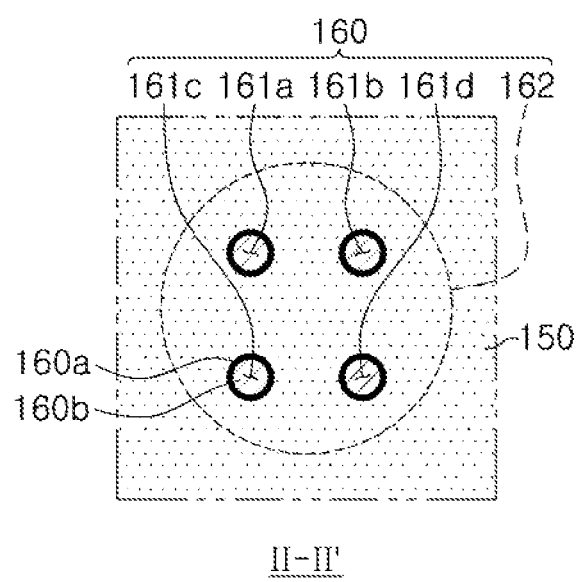

FIGS. 11A and 11B are, respectively, a schematic cross-sectional view and a schematic plan view illustrating a modified example of an opening of a passivation layer and an under-bump metal layer of the fan-out semiconductor package of FIG. 9.

Referring to the drawings, an opening 151 of a passivation layer 150 may be formed of a plurality of holes, and an under-bump metal layer 160 may include an external connection pad 162 formed on the passivation layer 150 and a plurality of vias 161a, 161b, 161c, and 161d formed in the opening 151 of the passivation layer 150 formed of the plurality of holes and connecting the external connection pad 162 and a redistribution layer 142 of a second interconnection member 140 to each other. In this case, stress may be dispersed through the plurality of vias 161a, 161b, 161c, and 161d, and a metal portion may be increased through the plurality of vias 161a, 161b, 161c, and 161d to secure sufficient stress resistance. Resultantly, the problem of the board level reliability described above may be prevented. The plurality of vias 161a, 161b, 161c, and 161d may completely fill the plurality of holes constituting the opening of the passivation layer 150, or fill only portions of the holes along walls of the respective holes in some case. The external connection pad 162 may be formed on the plurality of vias 161a, 161b, 161c, and 161d, and may extend to a surface of the passivation layer 150.

The under-bump metal layer 160 may include a first conductor layer 160a formed on the walls of the plurality of holes constituting the opening exposing the redistribution layer 142 and the surface of the passivation layer 150, and a second conductor layer 160b formed on the first conductor layer 160a, in terms of materials. The first conductor layer 160a may serve as a seed layer, and the second conductor layer 160b may substantially serve as the under-bump metal layer 160. The first and second conductor layers 160a and 160b may include the known conductive materials, preferably, electroless copper (Cu) and electrolytic copper (Cu), respectively. The first conductor layer 160a may serve as the seed layer to thus have a very thin thickness. Therefore, the first conductor layer 160a may have a thickness less than that of the second conductor layer 160b.

A plurality of dimples corresponding to the plurality of vias 161a, 161b, 161c, and 161d, respectively, may be formed on a surface of the external connection pad 162 to arrive at inner portions of the plurality of vias 161a, 161b, 161c, and 161d. Resultantly, reliability may be further improved.

Figure 12A:
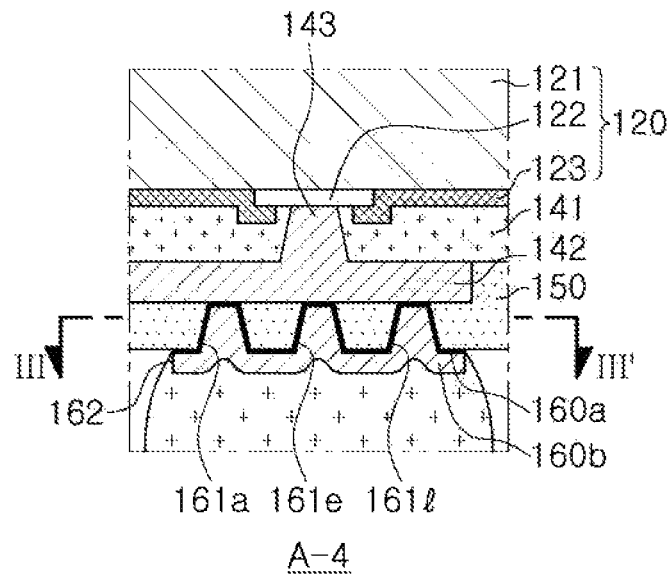
FIGS. 12A and 12B are, respectively, a schematic cross-sectional view and a schematic plan view illustrating another modified example of an opening of a passivation layer and an under-bump metal layer of the fan-out semiconductor package of FIG. 9.
Figure 12B:
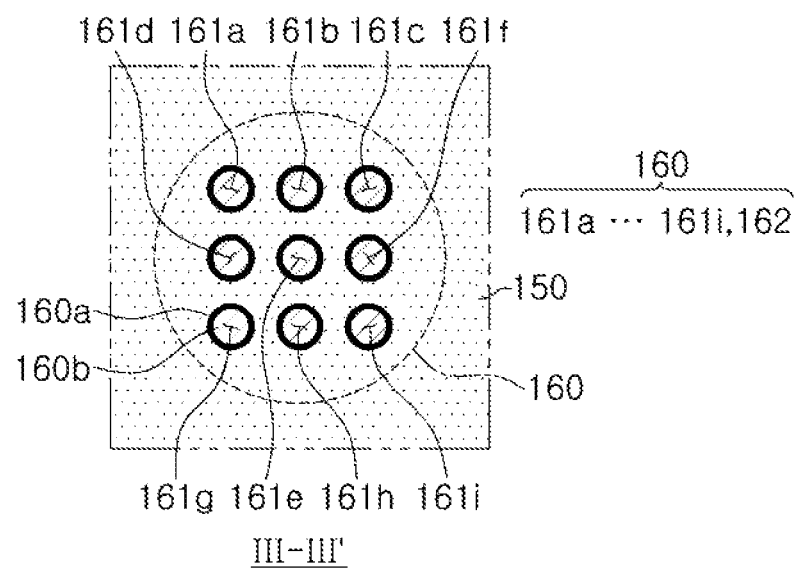

FIGS. 12A and 12B are, respectively, a schematic cross-sectional view and a schematic plan view illustrating another modified example of an opening of a passivation layer and an under-bump metal layer of the fan-out semiconductor package of FIG. 9.

Referring to the drawings, an opening 151 of a passivation layer 150 may be formed of a larger number of holes, and an under-bump metal layer 160 may include an external connection pad 162 formed on the passivation layer 150 and a larger number of vias 161a to 161i formed in the opening 151 of the passivation layer 150 formed of a larger number of holes and connecting the external connection pad 162 and a redistribution layer 142 of a second interconnection member 140 to each other. That is, the number of vias is not particularly limited. A description of other configurations except for the abovementioned configuration overlaps that described above.

Figure 13:
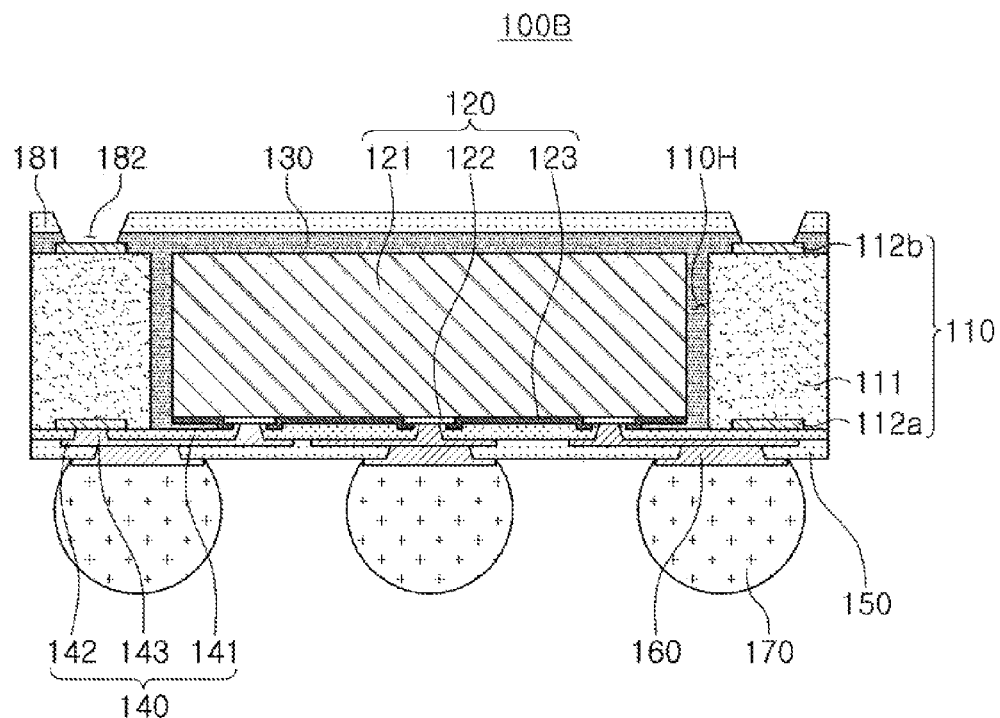
FIG. 13 is a schematic cross-sectional view illustrating another example of a fan-out semiconductor package.

FIG. 13 is a schematic cross-sectional view illustrating another example of a fan-out semiconductor package.

Referring to the drawing, a fan-out semiconductor package 100B according to another exemplary embodiment in the present disclosure may further include a reinforcing layer 181 disposed on an encapsulant 130. The reinforcing layer 181 may be, for example, ABF including an inorganic filler and an insulating resin, but is not limited thereto. In some cases, a composition of the reinforcing layer 181 may be the same as that of the passivation layer 150. This case may be more beneficial to controlling warpage by a symmetry effect. The reinforcing layer 181 may have a modulus of elasticity greater than that of the encapsulant 130. A weight percentage of the inorganic filler included in the reinforcing layer 181 may be greater than that of the inorganic filler included in the encapsulant 130. In this case, the reinforcing layer 181 may have a CTE lower than that of the encapsulant 130. In addition, a thickness of the reinforcing layer 181 may be greater than that of the encapsulant 130 in relation to an inactive surface of a semiconductor chip 120. Warpage of the fan-out semiconductor package 100B may be suppressed by introducing the reinforcing layer 181 described above. The reinforcing layer 181 may be attached to the encapsulant 130 in a hardened state, and a surface of the reinforcing layer 181 in contact with the encapsulant 130 may be thus flat. Openings 182 exposing at least portions of a second redistribution layer 112b of a first interconnection member 110 may be formed in the reinforcing layer 181 and the encapsulant 130, and may be used as markings, or the like. A description, or the like, of other configurations except for the abovementioned configuration overlaps that described above, and is thus omitted.

Figure 14:
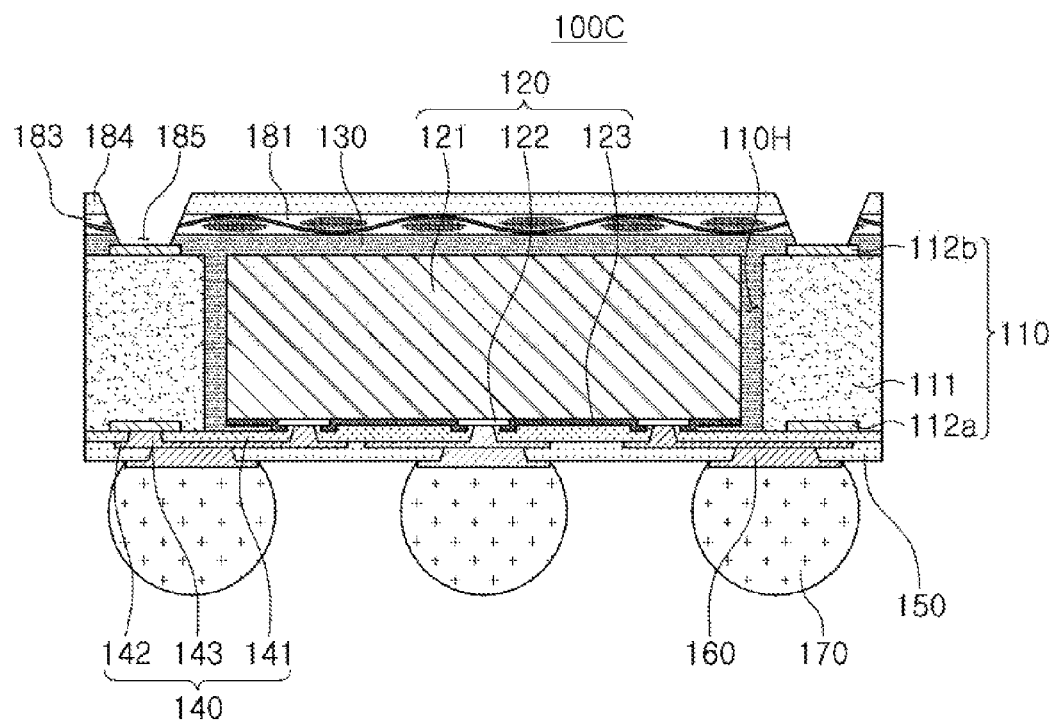
FIG. 14 is a schematic cross-sectional view illustrating another example of a fan-out semiconductor package.

FIG. 14 is a schematic cross-sectional view illustrating another example of a fan-out semiconductor package.

Referring to the drawing, a fan-out semiconductor package 100C according to another exemplary embodiment in the present disclosure may further include a reinforcing layer 183 disposed on an encapsulant 130. In this case, the reinforcing layer 183 may include a core material, an inorganic filler, and an insulating resin. The reinforcing layer 183 may be, for example, an unclad copper clad laminate (CCL). The unclad CCL that is not hardening-shrunk may hold the fan-out semiconductor package 100C at the time of hardening-shrinking the encapsulant 130. In this case, the reinforcing layer 183 may include the core material to thus have a relatively large elastic modulus. That is, the reinforcing layer 183 may have a modulus of elasticity greater than that of the encapsulant 130. That is, warpage of the fan-out semiconductor package 100C occurring at the time of being hardening-shrunk may be suppressed. The reinforcing layer 183 may be attached to the encapsulant 130 in a hardened state, and a surface of the reinforcing layer 183 in contact with the encapsulant 130 may be thus flat.

A resin layer 184 may be further disposed on the reinforcing layer 183. The resin layer 184 may be formed of a composition that is the same as or similar to that of the encapsulant 130. For example, the resin layer 184 may include an inorganic filler and an insulating resin, but may not include a core material. That is, the resin layer 184 may be ABF having a property that is the same as or similar to that of the encapsulant 130, but is not limited thereto. The resin layer 184 may be disposed in order to facilitate formation of openings 185. When the reinforcing layer 183 is formed at an outermost portion, it may be difficult to form the openings 185. However, when the resin layer 184 is disposed on the reinforcing layer 183, it may be easy to form the openings 185. The openings 185 may be used as markings, or the like. In addition, when the resin layer 184 is further disposed, warpage may be more effectively suppressed. The resin layer 184 may be attached to the reinforcing layer 183 in a hardened state, and a surface of the resin layer 184 in contact with the reinforcing layer 183 may be thus flat. A description, or the like, of other configurations except for the abovementioned configuration overlaps that described above, and is thus omitted.

Figure 15:
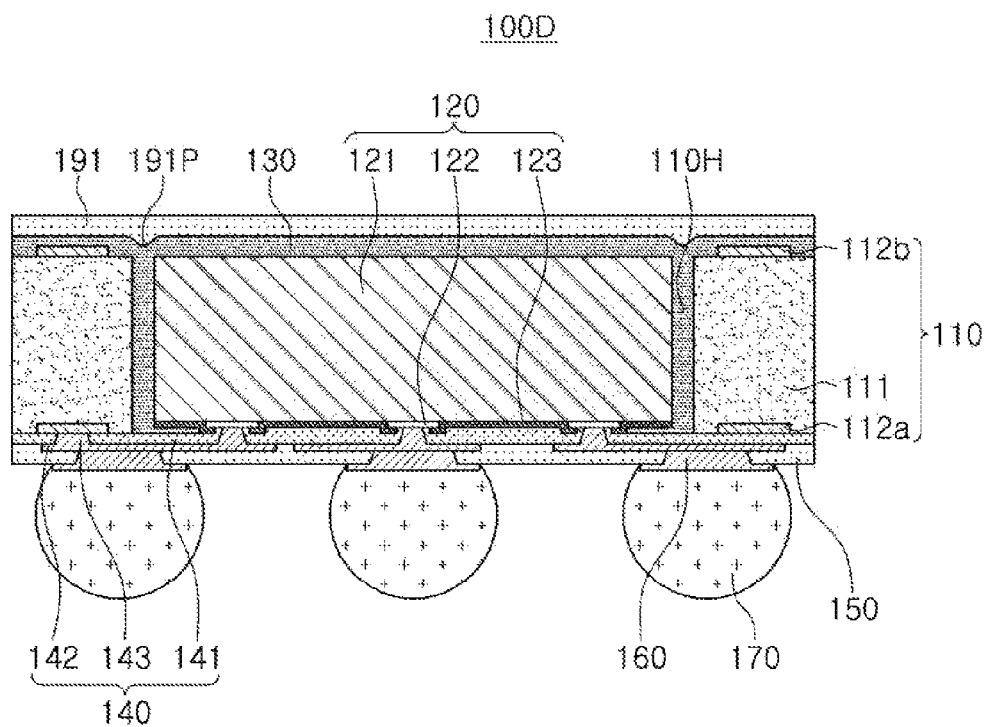
FIG. 15 is a schematic cross-sectional view illustrating another example of a fan-out semiconductor package.

FIG. 15 is a schematic cross-sectional view illustrating another example of a fan-out semiconductor package.

Referring to the drawing, a fan-out semiconductor package 100D according to another exemplary embodiment in the present disclosure may further include a reinforcing layer 191 disposed on an encapsulant 130. In this case, the reinforcing layer 191 may include an inorganic filler and an insulating resin. However, the reinforcing layer 191 may be attached to the encapsulant 130 in a non-hardened state and be then hardened.

That is, ABF in a non-hardened state, or the like, may be used as a material of the reinforcing layer 191. In this case, a material of the reinforcing layer 191 having a small CTE may be permeated into a through-hole 110H due to mixture between heterogeneous materials in contact with each other or movement of a boundary surface. Therefore, regions of the encapsulant 130 filling spaces between a first interconnection member 110 and a semiconductor chip 120 may have dimples 191P filled with the reinforcing layer 191. In this case, close adhesion between the reinforcing layer 191 and the encapsulant 130 may be further improved. That is, a surface of the reinforcing layer 191 in contact with the encapsulant 130 may not be flat. A weight percentage of the inorganic filler included in the reinforcing layer 191 may be greater than that of the inorganic filler included in the encapsulant 130. Therefore, the reinforcing layer 191 may have a CTE lower than that of the encapsulant 130. In addition, a thickness of the reinforcing layer 191 may be greater than that of the encapsulant 130 in relation to an inactive surface of a semiconductor chip 120. Warpage of the fan-out semiconductor package 100D may be suppressed by introducing the reinforcing layer 191 described above. A description, or the like, of other configurations except for the abovementioned configuration overlaps that described above, and is thus omitted.

Figure 16:
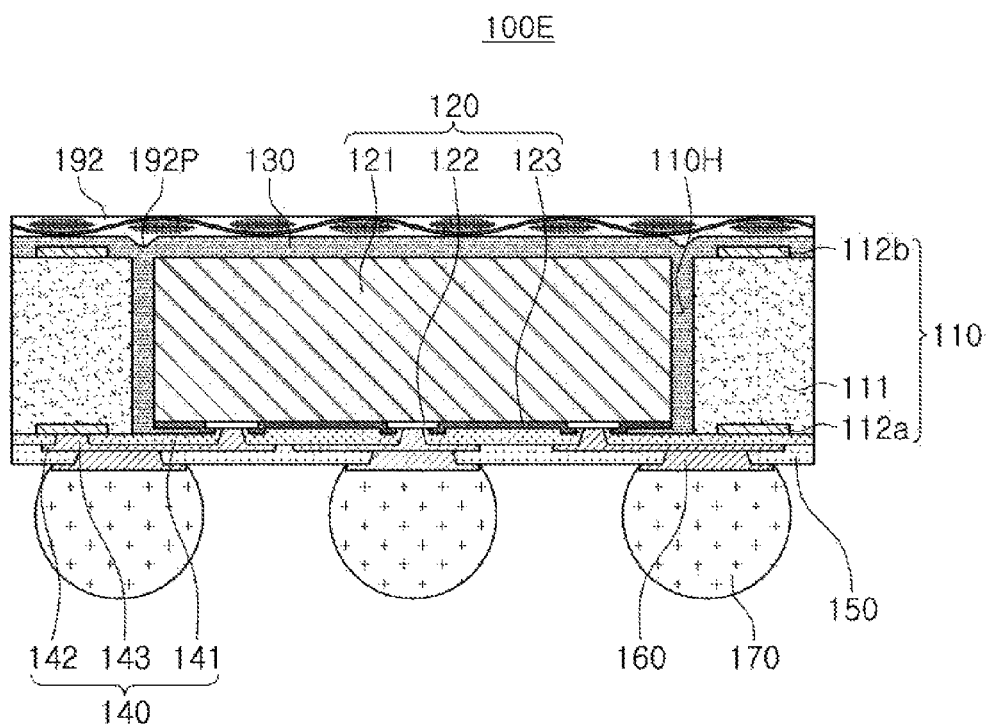
FIG. 16 is a schematic cross-sectional view illustrating another example of a fan-out semiconductor package.

FIG. 16 is a schematic cross-sectional view illustrating another example of a fan-out semiconductor package.

Referring to the drawing, a fan-out semiconductor package 100E according to another exemplary embodiment in the present disclosure may further include a reinforcing layer 192 disposed on an encapsulant 130. In this case, the reinforcing layer 192 may include a core material, an inorganic filler, and an insulating resin. However, the reinforcing layer 192 may be attached to the encapsulant 130 in a non-hardened state and be then hardened. That is, prepreg in a non-hardened state, or the like, may be used as a material of the reinforcing layer 192. In this case, a material of the reinforcing layer 192 having a small CTE may be permeated into a through-hole 110H due to mixture between heterogeneous materials in contact with each other or movement of a boundary surface. That is, regions of the encapsulant 130 filling spaces between a first interconnection member 110 and a semiconductor chip 120 may have dimples 192P filled with the reinforcing layer 192. In this case, close adhesion between the reinforcing layer 192 and the encapsulant 130 may be further improved. That is, a surface of the reinforcing layer 192 in contact with the encapsulant 130 may not be flat. In some case, an asymmetrical material of which amounts of inorganic filler are different from each other in relation to the core material may also as used as the material of the reinforcing layer 192. That is, asymmetrical prepreg in a non-hardened state may also be used as the material of the reinforcing layer 192. In this case, weight percents of the inorganic filler may be greater in a sequence of the encapsulant 130, a portion of the reinforcing layer 192 adjacent to the encapsulant 130, and an opposite portion of the reinforcing layer 192 to the portion of the reinforcing layer 192 adjacent to the encapsulant 130. A description, or the like, of other configurations except for the abovementioned configuration overlaps that described above, and is thus omitted.

Figure 17:
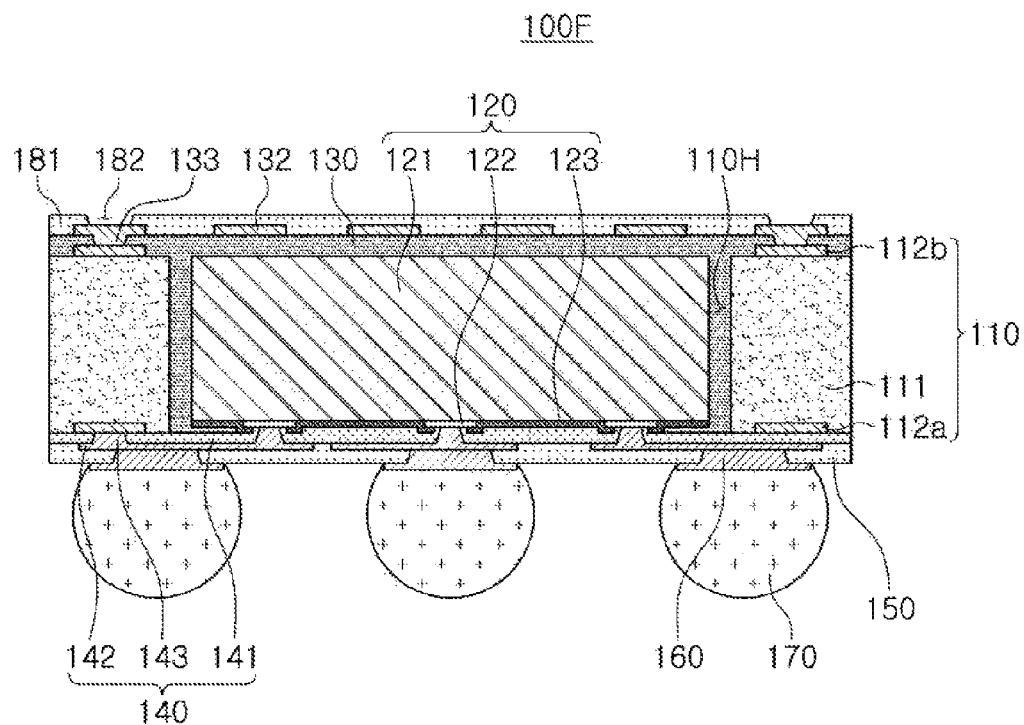
FIG. 17 is a schematic cross-sectional view illustrating another example of a fan-out semiconductor package.

FIG. 17 is a schematic cross-sectional view illustrating another example of a fan-out semiconductor package.

Referring to the drawing, a fan-out semiconductor package 100F according to another exemplary embodiment in the present disclosure may further include a backside redistribution layer 132 disposed on an encapsulant 130 and backside vias 133 penetrating through the encapsulant 130 and connecting the backside redistribution layer 132 to a second redistribution layer 112b of a first interconnection member 110. In addition, the fan-out semiconductor package 100F may further include a reinforcing layer 181 disposed on the encapsulant 130 and covering the backside redistribution layer 132. The reinforcing layer 181 may have openings 182 exposing at least portions of the backside redistribution layer 132. The backside redistribution layer 132 may be utilized as various redistribution patterns, and may also be utilized as connection terminal pads, or the like. In some cases, the backside redistribution layer 132 may be utilized as heat radiation patterns and electromagnetic interference (EMI) blocking patterns. The backside redistribution layer 132 and the backside vias 133 may include the known conductive material. The reinforcing layer 181 may be, for example, ABF including an inorganic filler and an insulating resin, but is not limited thereto. Reinforcing layers 183, 191, and 192 formed of a material different from that of the reinforcing layer 181 may be disposed instead of the reinforcing layer 181. A description, or the like, of other configurations except for the abovementioned configuration overlaps that described above, and is thus omitted.

Figure 18:
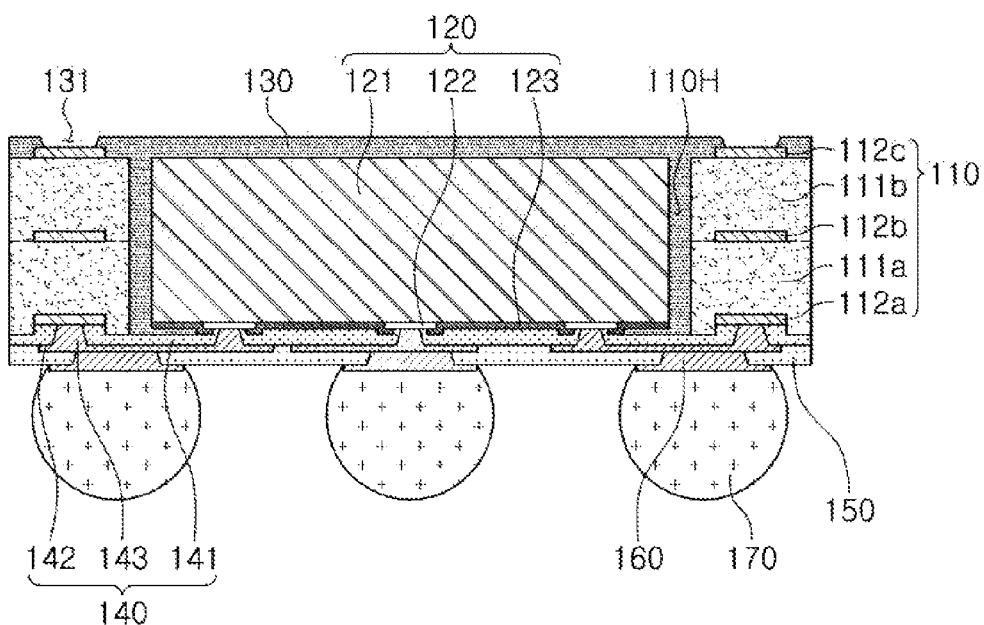
FIG. 18 is a schematic cross-sectional view illustrating another example of a fan-out semiconductor package.

FIG. 18 is a schematic cross-sectional view illustrating another example of a fan-out semiconductor package.

Referring to the drawing, in a fan-out semiconductor package 100G according to another exemplary embodiment in the present disclosure, a first interconnection member 110 may include a first insulating layer 111a in contact with a second interconnection member 140, a first redistribution layer 112a in contact with the second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. Meanwhile, although not illustrated in the drawing, the first and second redistribution layers 112a and 112b and the second and third redistribution layers 112b and 112c may be electrically connected to each other through first and second vias penetrating through the first and second insulating layers 111a and 111b, respectively.

Since the first redistribution layer 112a is embedded, an insulating distance of an insulating layer 141 of the second interconnection member 140 may be substantially constant, as described above. Since the first interconnection member 110 may include a large number of redistribution layers 112a, 112b, and 112c, the second interconnection member 140 may be further simplified. Therefore, a decrease in a yield depending on a defect occurring in a process of forming the second interconnection member 140 may be suppressed. The first redistribution layer 112a may be recessed into the first insulating layer 111a, such that a lower surface of the first insulating layer 111a and a lower surface of the first redistribution layer 112a have a step therebetween. Resultantly, when an encapsulant 130 is formed, a phenomenon in which a material of the encapsulant 130 bleeds to pollute the first redistribution layer 112a may be prevented.

The lower surface of the first redistribution layer 112a of the first interconnection member 110 may be disposed on a level above a lower surface of the connection pads 122 of the semiconductor chip 120. In addition, a distance between a redistribution layer 142 of the second interconnection member 140 and the first redistribution layer 112a of the first interconnection member 110 may be greater than that between the redistribution layer 142 of the second interconnection member 140 and the connection pads 122 of the semiconductor chip 120. The reason is that the first redistribution layer 112a may be recessed into the insulating layer 111. The second redistribution layer 112b of the first interconnection member 110 may be disposed on a level between an active surface and an inactive surface of the semiconductor chip 120. The first interconnection member 110 may be formed at a thickness corresponding to that of the semiconductor chip 120. Therefore, the second redistribution layer 112b formed in the first interconnection member 110 may be disposed on a level between the active surface and the inactive surface of the semiconductor chip 120.

Thicknesses of the redistribution layers 112a, 112b, and 112c of the first interconnection member 110 may be greater than those of the redistribution layers 142 of the second interconnection member 140. Since the first interconnection member 110 may have a thickness equal to or greater than that of the semiconductor chip 120, the redistribution layers 112a, 112b, and 112c may be formed to have large sizes depending on a scale of the first interconnection member 110. On the other hand, the redistribution layers 142 of the second interconnection member 140 may be formed at a relatively small size for thinness.

A description, or the like, of other configurations except for the abovementioned configuration overlaps that described above, and is thus omitted. Meanwhile, the descriptions of the fan-out semiconductor packages 100B to 100F described above may also be applied to the fan-out semiconductor package 100G.

Figure 19:
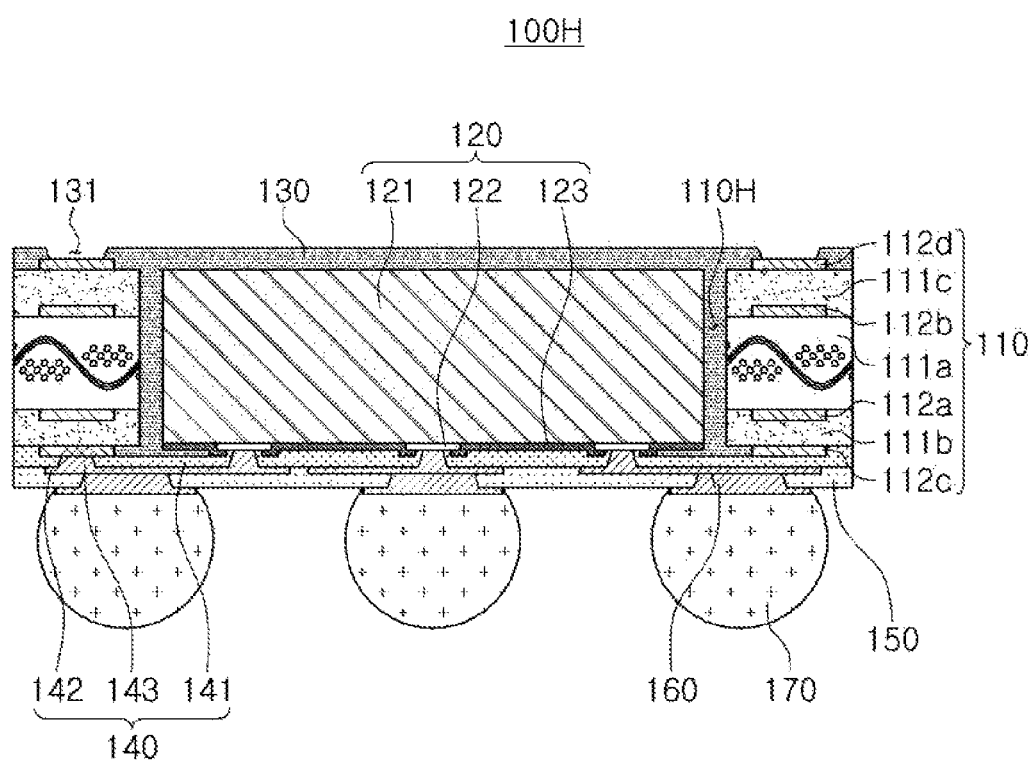
FIG. 19 is a schematic cross-sectional view illustrating another example of a fan-out semiconductor package.

FIG. 19 is a schematic cross-sectional view illustrating another example of a fan-out semiconductor package.

Referring to the drawing, in a fan-out semiconductor package 100H according to another exemplary embodiment in the present disclosure, a first interconnection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first interconnection member 110 may include a larger number of redistribution layers 112a, 112b, 112c, and 112d, the second interconnection member 140 may be further simplified. Therefore, a decrease in a yield depending on a defect occurring in a process of forming the second interconnection member 140 may be suppressed. Meanwhile, although not illustrated in the drawing, the first to fourth redistribution layers 112a, 112b, 112c, and 112d may be electrically connected to each other through first to third vias penetrating through the first to third insulating layers 111a, 111b, and 111c, respectively.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first interconnection member 110 may be disposed on a level below a lower surface of the connection pads 122 of the semiconductor chip 120. In addition, a distance between a redistribution layer 142 of the second interconnection member 140 and the third redistribution layer 112c of the first interconnection member 110 may be smaller than that between the redistribution layer 142 of the second interconnection member 140 and the connection pads 122 of the semiconductor chip 120. The reason is that the third redistribution layer 112c may be disposed in a protruding form on the second insulating layer 111b, resulting in contact with the second interconnection member 140. The first redistribution layer 112a and the second redistribution layer 112b of the first interconnection member 110 may be disposed on a level between an active surface and an inactive surface of the semiconductor chip 120. The first interconnection member 110 may be formed at a thickness corresponding to that of the semiconductor chip 120. Therefore, the first redistribution layer 112a and the second redistribution layer 112b formed in the first interconnection member 110 may be disposed on a level between the active surface and the inactive surface of the semiconductor chip 120.

Thicknesses of the redistribution layers 112a, 112b, 112c, and 112d of the first interconnection member 110 may be greater than those of the redistribution layers 142 of the second interconnection member 140. Since the first interconnection member 110 may have a thickness equal to or greater than that of the semiconductor chip 120, the redistribution layers 112a, 112b, 112c, and 112d may also be formed to have large sizes. On the other hand, the redistribution layers 142 of the second interconnection member 140 may be formed at a relatively small size for thinness.

A description, or the like, of other configurations except for the abovementioned configuration overlaps that described above, and is thus omitted. Meanwhile, the descriptions of the fan-out semiconductor packages 100B to 100F described above may also be applied to the fan-out semiconductor package 100H.

As set forth above, according to the exemplary embodiment in the present disclosure, a fan-out semiconductor package of which board level reliability is improved may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a semiconductor chip having an active surface having connection pads disposed thereon and an inactive surface opposing the active surface;
an encapsulant encapsulating at least portions of the inactive surface of the semiconductor chip;
a second interconnection member disposed on a portion of the encapsulant and on the active surface of the semiconductor chip;
a first passivation layer disposed on the second interconnection member,
wherein the second interconnection member includes a redistribution layer electrically connected to the connection pads of the semiconductor chip,
the second interconnection member includes an insulating layer on which the redistribution layer of the second interconnection member is disposed, and
the first passivation layer has a modulus of elasticity greater than that of the insulating layer of the second interconnection member, wherein the first passivation layer is an outermost insulating layer of the fan-out semiconductor package.

2. The fan-out semiconductor package of claim 1, wherein a thickness of the first passivation layer is thicker than that of the insulating layer of the second interconnection member.

3. The fan-out semiconductor package of claim 1, wherein a thickness of the first passivation layer is 10 μm or more.

4. The fan-out semiconductor package of claim 1, wherein a surface roughness (Ra) of the first passivation layer is 1 nm or more.

5. The fan-out semiconductor package of claim 1, wherein water absorption of the first passivation layer is 1.5% or less.

6. The fan-out semiconductor package of claim 1, wherein the insulating layer of the second interconnection member is a photosensitive insulating layer, and
the first passivation layer is a non-photosensitive insulating layer including an inorganic filler.

7. The fan-out semiconductor package of claim 1, further comprising a first interconnection member having a through-hole,
wherein the semiconductor chip is disposed in the through-hole of the first interconnection member,
the first interconnection member includes a first insulating layer, a first redistribution layer in contact with the second interconnection member and embedded in the first insulating layer, and a second redistribution layer disposed on a surface of the first insulating layer opposing a surface of the first insulating layer in which the first redistribution layer is embedded, and
the first and second redistribution layers are electrically connected to the connection pads.

8. The fan-out semiconductor package of claim 7, wherein the first interconnection member further includes a second insulating layer disposed on the first insulating layer and covering the second redistribution layer and a third redistribution layer disposed on the second insulating layer, and
the third redistribution layer is electrically connected to the connection pads.

9. The fan-out semiconductor package of claim 8, further comprising:
a backside redistribution layer disposed on the encapsulant and electrically connected to the third redistribution layer; and
a second passivation layer disposed on the encapsulant and having openings exposing at least portions of the backside redistribution layer.

10. The fan-out semiconductor package of claim 8, wherein a thickness of the first passivation layer is thicker than that of the insulating layer of the second interconnection member.

11. The fan-out semiconductor package of claim 9, wherein the second passivation layer is a non-photosensitive insulating layer including an inorganic filler.

12. The fan-out semiconductor package of claim 9, wherein the second passivation layer comprises a same material as the first passivation layer.

13. The fan-out semiconductor package of claim 9, further comprising:
a reinforcing layer disposed on the encapsulant; and
a resin layer disposed on the reinforcing layer,
wherein the backside redistribution layer and the second passivation layer are disposed on the resin layer.

14. The fan-out semiconductor package of claim 13, wherein the reinforcing layer comprises a core material, an inorganic filler, and an insulating resin.

15. The fan-out semiconductor package of claim 8, wherein a distance between the redistribution layer of the second interconnection member and the first redistribution layer is greater than that between the redistribution layer of the second interconnection member and the connection pads.

16. The fan-out semiconductor package of claim 8, wherein the first redistribution layer has a thickness greater than that of the redistribution layer of the second interconnection member.

17. The fan-out semiconductor package of claim 8, wherein a lower surface of the first redistribution layer is disposed on a level above a lower surface of the connection pads.

18. The fan-out semiconductor package of claim 8, wherein the second redistribution layer is disposed on a level between the active surface and the inactive surface of the semiconductor chip.

19. The fan-out semiconductor package of claim 1, further comprising a first interconnection member having a through-hole,
wherein the semiconductor chip is disposed in the through-hole of the first interconnection member,
the first interconnection member includes a first insulating layer, and a first redistribution layer and a second redistribution layer disposed on opposite surfaces of the first insulating layer, respectively, and
the first and second redistribution layers are electrically connected to the connection pads.

20. The fan-out semiconductor package of claim 19, wherein the first interconnection member further includes a second insulating layer disposed on the first insulating layer and covering the first redistribution layer, and a third redistribution layer disposed on the second insulating layer, and
the third redistribution layer is electrically connected to the connection pads.

21. The fan-out semiconductor package of claim 20, wherein the first interconnection member further includes a third insulating layer disposed on the first insulating layer and covering the second redistribution layer and a fourth redistribution layer disposed on the third insulating layer, and
the fourth redistribution layer is electrically connected to the connection pads.

22. The fan-out semiconductor package of claim 20, wherein the first insulating layer has a thickness greater than that of the second insulating layer.

23. The fan-out semiconductor package of claim 20, wherein a thickness of the first passivation layer is thicker than that of the insulating layer of the second interconnection member.

24. The fan-out semiconductor package of claim 20, wherein the third redistribution layer has a thickness greater than that of the redistribution layer of the second interconnection member.

25. The fan-out semiconductor package of claim 20, wherein the first redistribution layer is disposed on a level between the active surface and the inactive surface of the semiconductor chip.

26. The fan-out semiconductor package of claim 20, wherein a lower surface of the third redistribution layer is disposed on a level below a lower surface of the connection pads.

27. The fan-out semiconductor package of claim 1, further comprising an insulating member having a through-hole,
wherein the semiconductor chip is disposed in the through-hole of the insulating member.

28. The fan-out semiconductor package of claim 1, wherein the encapsulant includes an inorganic filler and an insulating resin.

29. The fan-out semiconductor package of claim 1, further comprising a reinforcing layer disposed on the encapsulant,
wherein the reinforcing layer has a modulus of elasticity greater than that of the encapsulant.

30. The fan-out semiconductor package of claim 1, further comprising:
openings penetrating through the first passivation layer and exposing at least portions of the redistribution layer of the second interconnection member;
an under-bump metal layer formed on the openings and connected to the exposed at least portions of the redistribution layer of the second interconnection member; and
connection terminals formed on the under-bump metal layer, at least one of the connection terminals being disposed in a fan-out region.

31. The fan-out semiconductor package of claim 30, wherein the under-bump metal layer includes an external connection pad formed on the first passivation layer and a plurality of vias formed in the openings and connecting the external connection pad and the redistribution layer of the second interconnection member to each other.

32. The fan-out semiconductor package of claim 31, wherein a plurality of dimples corresponding to the plurality of vias, respectively, are formed on a surface of the external connection pad.

33. A fan-out semiconductor package comprising:
a semiconductor chip having an active surface having connection pads disposed thereon and an inactive surface opposing the active surface;
an encapsulant encapsulating at least portions of the inactive surface of the semiconductor chip;
a second interconnection member disposed on a portion of the encapsulant and on the active surface of the semiconductor chip; and
a passivation layer disposed on the second interconnection member,
wherein the second interconnection member includes a redistribution layer electrically connected to the connection pads of the semiconductor chip,
the second interconnection member includes an insulating layer on which the redistribution layer of the second interconnection member is disposed,
each of the passivation layer and the insulating layer of the second interconnection member includes an inorganic filler and an insulating resin, and
a weight percentage of the inorganic filler included in the passivation layer is greater than that of the inorganic filler included in the insulating layer of the second interconnection member,
wherein the passivation layer is an outermost insulating layer of the fan-out semiconductor package.

* * * * *